United States Patent
Ito et al.

(10) Patent No.: US 7,515,621 B2
(45) Date of Patent: Apr. 7, 2009

(54) NITRIDE SEMICONDUCTOR LASER ELEMENT

(75) Inventors: Shigetoshi Ito, Shijonawate (JP); Yuhzoh Tsuda, Sakurai (JP); Yoshihiro Ueta, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 14 days.

(21) Appl. No.: 11/702,625

(22) Filed: Feb. 6, 2007

(65) Prior Publication Data

US 2007/0297476 A1 Dec. 27, 2007

(30) Foreign Application Priority Data

Feb. 8, 2006 (JP) ............................. 2006-030442

(51) Int. Cl.
*H01S 5/00* (2006.01)

(52) U.S. Cl. ............... 372/45.01; 372/43.01; 372/46.01

(58) Field of Classification Search .............. 372/43.01, 372/45.01, 46.01
See application file for complete search history.

(56) References Cited

U.S. PATENT DOCUMENTS

2006/0262823 A1* 11/2006 Sugimoto et al. ........ 372/45.01

FOREIGN PATENT DOCUMENTS

| JP | 10-084132 | 3/1998 |
|----|-----------|--------|
| JP | 2004-031770 | 1/2004 |

* cited by examiner

*Primary Examiner*—Dung T Nguyen
(74) *Attorney, Agent, or Firm*—Harness, Dickey & Pierce, P.L.C.

(57) ABSTRACT

A nitride semiconductor laser element includes a lower clad layer, a lower adjacent layer, a quantum well active layer, an upper adjacent layer and an upper clad layer in this order. The quantum well active layer includes a plurality of well layers formed of undoped InGaN, and an undoped barrier layer sandwiched between the well layers. The barrier layer includes a first layer formed of InGaN, a second layer formed of GaN, and a third layer formed of InGaN. The In composition ratio of the first layer and the In composition ratio of the third layer are less than half the In composition ratio of the well layer.

6 Claims, 1 Drawing Sheet

NITRIDE SEMICONDUCTOR LASER ELEMENT

This nonprovisional application is based on Japanese Patent Application No. 2006-030442 filed with the Japan Patent Office on Feb. 8, 2006, the entire contents of which are hereby incorporated by reference.

BACKGROUND OF THE INVENTION

1. Field of the Invention

The present invention relates to a nitride semiconductor laser element, particularly a nitride semiconductor laser element having a high COD (catastrophic optical damage) level.

2. Description of the Background Art

Nitride semiconductor laser elements are promising in the field of application to the light source of short wavelength light for reading and writing optical disk information as well as the light source of short wavelength light of high power.

For the active layer of a nitride semiconductor laser element, research efforts are made on a quantum well active layer of a quantum well structure having a well layer and a barrier layer stacked. In a quantum well active layer, the state density function ρof electrons and holes can be regulated narrow artificially. Therefore, the usage of a quantum well active layer allows the properties of a nitride semiconductor laser element to be improved since the oscillation threshold value of the nitride semiconductor laser element can be reduced than in the case where an active layer that does not have a quantum well structure (such as a nitride semiconductor laser element of a double hetero structure type) is employed.

For example, Patent Document 1 (Japanese Patent Laying-Open No. 2004-031770) discloses a nitride semiconductor light emitting element having a barrier layer formed of a plurality of layers including a doped layer into which n type impurities are doped and an undoped layer into which n type impurities are not doped, wherein the doped layer of the barrier layer is arranged adjacent to the well layer.

This nitride semiconductor light emitting element aims to facilitate generation of carriers efficiently while suppressing the concentration of n impurities in the barrier layer and suppressing internal loss caused by free carrier dispersion. This nitride semiconductor light emitting element is based on the approach of generating carriers by doping n type impurities into the active layer to reduce the threshold current at the time of driving.

Patent Document 2 (Japanese Patent Laying-Open No. 10-084132) discloses a nitride semiconductor light emitting diode element employing undoped GaN for the barrier layer and undoped $In_{0.2}Ga_{0.8}N$ for the well layer with a buffer layer of undoped $In_{0.1}Ga_{0.9}N$ inserted between the well layer and barrier layer.

In the nitride semiconductor light emitting diode element of Patent Document 2, the buffer layer is provided for the purpose of alleviating variation in the lattice constant between the well layer and the barrier layer. A nitride semiconductor having a high In composition ratio of 0.2 is employed for the well layer. Furthermore, GaN is employed for the barrier layer to provide a large potential barrier between the well layer and the barrier layer to increase light emission.

Therefore, the difference in lattice constant between the well layer and the barrier layer is regarded as a problem in the nitride semiconductor light emitting diode element of Patent Document 2. In order to alleviate this difference in lattice constant, it is necessary to employ a nitride semiconductor having a high In composition ratio of 0.1.

SUMMARY OF THE INVENTION

The nitride semiconductor light emitting element of Patent Document 1 is provided mainly focusing on reducing the threshold current. It is not provided in view of the problem of catastrophic optical damage (COD) at the output mirror facet when the nitride semiconductor laser element is operated at high power. Furthermore, the nitride semiconductor light emitting diode element of Patent Document 2 was not provided in consideration of the problem of COD.

In order to emit a laser beam of high power stably over a long period of time, the COD level (the level of light output at which COD occurs) must be maintained high even in the case where the nitride semiconductor laser element is operated for a long period of time.

An object of the present invention is to provide a nitride semiconductor laser element that allows for improvement in the COD level.

The present invention is directed to a nitride semiconductor laser element including a lower clad layer, a lower adjacent layer, a quantum well active layer, an upper adjacent layer, and an upper clad layer, provided in this order. The quantum well active layer includes a plurality of well layers formed of undoped InGaN and an undoped barrier layer sandwiched between the well layers. The barrier layer includes a first layer formed of InGaN, a second layer formed of GaN, and a third layer formed of InGaN. The In composition ratio of the first layer and the In composition ratio of the third layer are each less than half the In composition ratio of each well layer.

In the nitride semiconductor laser element of the present invention, the wavelength of the laser beam output from the quantum well active layer is preferably at least 385 nm and 430 nm at most.

Further, in the nitride semiconductor laser element of the present invention, the In composition ratio of the well layer is preferably at least 0.04 and 0.12 at most.

Further, in the nitride semiconductor laser element of the present invention, the In composition ratio of the first layer and the In composition ratio of the third layer are each preferably at least 0.005 and 0.04 at most.

Further, in the nitride semiconductor laser element of the present invention, the upper adjacent layer preferably includes GaN or InGaN. The upper adjacent layer is preferably undoped.

In the nitride semiconductor laser element of the present invention, the lower adjacent layer preferably includes GaN or InGaN. The lower adjacent layer is preferably undoped.

According to the present invention, a nitride semiconductor laser element that allows for improvement in the COD level can be provided.

In the present invention, a nitride semiconductor laser element having the COD level maintained at a high level can be produced stably even in the case where a laser beam is oscillated at a high light power of at least 100 mW in a single lateral mode.

In the present invention, the surge resistance can be increased since the COD level of the nitride semiconductor laser element that does not require light of high power can be improved.

In the present invention, "undoped" means that p type impurities (magnesium or the like) and n type impurities (silicon or the like) are not intentionally doped into the nitride semiconductor crystal. In the nitride semiconductor crystal, impurities that are inevitably included such as carbon, hydrogen, oxygen, and chlorine may be contained. Further, intentional doping of p type impurities and/or n type impurities to a degree that does not substantially affect the conductivity (atom concentration: approximately below $5 \times 10^{16}/cm^3$) into the nitride semiconductor crystal falls within the range of the aforementioned "undoped".

In the present invention, "InGaN" implies a nitride semiconductor crystal represented by the composition formula of $In_xGa_yN$ (0<x<1, 0<y<1). In the present invention, In represents indium; Ga represents gallium; and N represents nitrogen.

In the present invention, "GaN" implies a gallium nitride crystal.

Further, "In composition ratio of the well layer" in the present invention implies the ratio of the number of In atoms to the sum of the number of In atoms and the number of Ga atoms in the well layer formed of InGaN.

Further, "In composition ratio of the first layer" in the present invention implies the ratio of the number of In atoms to the sum of the number of In atoms and the number of Ga atoms in the first layer formed of InGaN.

Further, "In composition ratio of the third layer" in the present invention implies the ratio of the number of In atoms to the sum of the number of In atoms and the number of Ga atoms in the third layer formed of InGaN.

Further, "quantum well active layer" in the present invention refers to the bottom-most well layer up to the topmost well layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
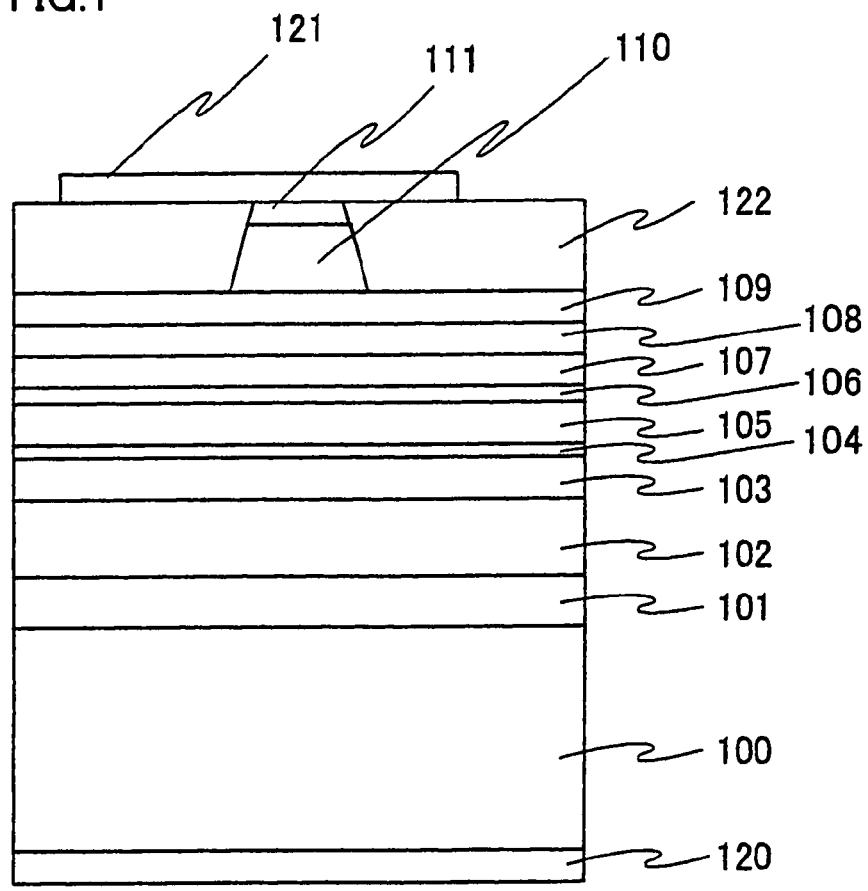
FIG. 1 is a schematic sectional view of an example of a nitride semiconductor laser element of the present invention.

Embodiments of the present invention will be described hereinafter. In the drawings, the same reference characters denote the same or corresponding elements.

First Embodiment

Referring to FIG. 1, a nitride semiconductor laser element of the present invention has a structure of a silicon (Si)-doped n type GaN layer 101 that is 0.2 μm in thickness, a Si-doped n type $Al_{0.05}Ga_{0.95}N$ lower clad layer 102 that is 4 μm in thickness, a Si-doped n type GaN guide layer 103 that is 0.1 μm in thickness, an undoped $In_{0.03}Ga_{0.97}N$ lower adjacent layer 104 that is 20 nm in thickness, a quantum well active layer 105, an undoped GaN upper adjacent layer 106 that is 20 nm in thickness, a Si-doped n type GaN layer 107 (first intermediate layer) that is 10 nm in thickness, an undoped GaN layer 108 (second intermediate layer) that is 40 nm in thickness, a magnesium (Mg)-doped p type $Al_{0.15}Ga_{0.85}N$ layer 109 (third intermediate layer) that is 10 nm in thickness, a Mg-doped p type $Al_{0.05}Ga_{0.95}N$ upper clad layer 110 that is 0.6 μm in thickness, and a Mg-doped p type GaN contact layer 111 that is 0.1 μm in thickness, all stacked in the this order on the surface of an n type GaN substrate 100.

An n side electrode 120 is formed on the backside of n type GaN substrate 100, and a p side electrode 121 is formed on the surface of p type GaN contact layer 111.

Further, p type $Al_{0.05}Ga_{0.95}N$ upper clad layer 110 and p type GaN contact layer 111 are formed in stripes extending in the direction of the length of the resonator, and constitute a ridge stripe waveguide.

The bottom of the ridge stripe is preferably located at the interface between p type $Al_{0.05}Ga_{0.95}N$ upper clad layer 110 and p type $Al_{0.15}Ga_{0.85}N$ layer 109, or in p type $Al_{0.05}Ga_{0.95}N$ upper clad layer 110.

The portion other than the ridge stripe is embedded with an insulation film 122 to realize current constriction. Although the width of the rigid stripe is set to 1.6 μm and the length of the resonator is set to 600 μm in the present embodiment, the present invention is not limited thereto.

The front side of the nitride semiconductor laser element of the present invention (the surface corresponding to the surface side of the drawing sheet of FIG. 1) is applied with an AR (Anti Reflective) coating, and the rear side (the surface corresponding to the back side of the drawing sheet of FIG. 1) is applied with an HR (High Reflective) coating.

The coating film employed for the AR coating and HR coating is preferably formed of a material that exhibits favorable adherence with the nitride semiconductor crystal at the side that is brought into contact with the surface of the nitride semiconductor crystal and that does not readily absorbed the output laser beam, such as aluminum oxide or aluminum nitride.

Figure 2:
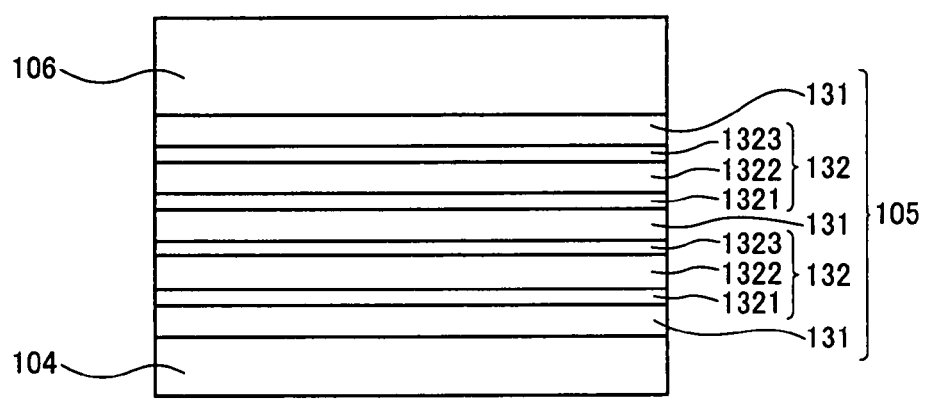
FIG. 2 is a schematic enlarged sectional view of a quantum well active layer shown in FIG. 1.

Referring to FIG. 2, quantum well active layer 105 has a multi-quantum well structure (three well layers) including undoped $In_{0.09}Ga_{0.91}N$ well layer 131 that is 4 nm in thickness and an undoped barrier layer 132 that is 9 nm in thickness, stacked in the order of a well layer, a barrier layer, a well layer, a barrier layer, and a well layer.

Barrier layer 132 is constituted of a 3 nm-thick first layer 1321 formed of $In_{0.03}Ga_{0.97}N$, a 3 nm-thick second layer 1322 formed of GaN, and a 3 nm-thick third layer 1323 formed of $In_{0.03}Ga_{0.97}N$, stacked in the noted order.

The well layer can be formed of InGaN. It is preferable from the standpoint of producing a nitride semiconductor laser element of favorable properties, achieving the effect of improving the COD level, to set the wavelength of the laser beam output from the nitride semiconductor laser element to at least 385 nm and 430 nm at most, and the In composition ratio to at least 0.04 and 0.12 at most. Further, from the standpoint of producing a nitride semiconductor laser element of further favorable properties and further improving the COD level, the In composition ratio is preferably set to at least 0.04 and 0.1 at most.

The barrier layer is selected to have a composition such that the bandgap is greater than that of the well layer. Further, the second layer in the barrier layer is provided to play the essential role of a barrier layer, i.e. separate the well layer in a multi-quantum well structure. In the present invention, the second layer must be formed of GaN.

The first and third layers are formed of InGaN, having a relatively low In composition ratio.

By employing a barrier layer of a structure in which the second layer formed of GaN is sandwiched between the first layer formed of InGaN and the third layer formed of InGaN, the COD level can be improved.

A conventional quantum well active layer was produced corresponding to a multi-quantum well structure having a well layer formed of InGaN and a barrier layer formed of InGaN stacked alternately. There was a tendency of COD readily occurring in a quantum well active layer of such a structure. This is considered to be caused by the successive stacking of layers formed of InGaN, leading to degradation in crystallinity as more layers are stacked.

The present invention is characterized in that a second layer formed of GaN is present in the barrier layer, reducing the tendency of degrading the crystallinity in accordance with the stacking. Thus, there is a tendency for the occurrence of COD to be suppressed.

In the present invention, the refractive index of the quantum well active layer can be increased by virtue of both the first and third layers formed of InGaN. Therefore, the threshold current density can be lowered even if n type impurities are not doped into the quantum well active layer as in the conventional case.

In the case where both the first and third layers are formed of GaN, light cannot be confined sufficiently in the quantum well active layer, leading to a higher threshold current density. This may reduce the lifetime of the nitride semiconductor laser element. Therefore, it is preferable to set the In composition ratio of the first layer and the In composition ratio of the third layer each to at least 0.005.

It is to be also noted that the crystallinity of the first and third layers is readily degraded when the In composition ratio of the first layer and the In composition ratio of the third layer are respectively increased. Therefore, the In composition ratio of the first layer and the In composition ratio of the third layer must be set to less than half the In composition ratio of the well layer. From the standpoint of further suppressing degradation in crystallinity, it is preferable to set the In composition ratio of the first layer and the In composition ratio of the third layer to less than half the In composition ratio of the well layer and also to 0.04 at most.

Further, the entire quantum well active layer including the well layer and barrier layer must be undoped. If n type impurities are doped into the quantum well active layer as in the conventional case, COD will readily occur due to degradation in crystallinity of the quantum well active layer.

In the present invention, a quantum well active layer of high quality having the COD suppressed sufficiently can be produced only by combining the structural elements of undoping the entire quantum well active layer, forming the well layer from InGaN, and sandwiching the second layer formed of GaN between first and third layers formed of InGaN corresponding to an In composition ratio that is less than half the In composition ratio of the well layer. There is also the advantage of suppressing increase in the threshold current density.

From the standpoint of suppressing degradation in the crystallinity of the quantum well active layer in accordance with the stacking of nitride semiconductor crystal layers, it is preferable to set the number of well layers to 5 layers or less.

The nitride semiconductor laser element of the present invention can be produced by the conventional crystal growing method of a nitride semiconductor crystal well known. For example, the nitride semiconductor laser element of the present invention can be produced by the formation of a stacked structure of a nitride semiconductor crystal based on metal organic chemical vapor deposition (MOCVD) and formation of a ridge stripe structure through etching employing a photoresist mask, or the like.

Upon driving the nitride semiconductor laser element of the first embodiment shown in FIGS. 1 and 2, the threshold current was 30 mA and the slope efficiency was 1.7 W/A at room temperature. It was confirmed that the threshold value and the driving current could be reduced.

In addition, the nitride semiconductor laser element of the first embodiment was driven continuously to output a laser beam in a pulsed manner (pulse width 30 ns, pulse duty 50%) at the power output of 200 mW under the temperature environment of 80° C. The COD level under pulsed condition was evaluated after 500 hours. It was identified that the nitride semiconductor laser element of the first embodiment had the COD level of at least 400 mW ensured, and is sufficiently durable to the drive of a long period at the power output of 200 mW. From the status of the change in the COD level, it is estimated that a COD level of at least 300 mW is ensured for the nitride semiconductor laser element of the first embodiment even under energization for 3000 hours.

COMPARATIVE EXAMPLE 1

A nitride semiconductor laser element having a structure identical to that of the nitride semiconductor laser element of the first embodiment was produced with the exception that the composition of second layer 1322 shown in FIG. 2 was $In_{0.03}Ga_{0.97}N$ (nitride semiconductor laser element of Comparative Example 1).

The properties of the nitride semiconductor laser element of Comparative Example 1 were evaluated under the same condition and same method as those of the nitride semiconductor laser element of the first embodiment. As to the initial properties, the threshold current was 25 mA and the slope efficiency was approximately 1.7 W/A at room temperature. It is considered that this is attributed to the confinement of light into the quantum well active layer being improved by the entire increase of the In composition ratio of the barrier layer.

Then, the nitride semiconductor laser element of Comparative Example 1 was driven continuously in a manner similar to that of the nitride semiconductor laser element of the first embodiment. There were many elements failed with the laser beam output ceased within 500 hours. Upon examining the cause thereof, the failure was attributed to the occurrence of COD.

The interior of the nitride semiconductor laser element of Comparative Example 1 with COD was analyzed in detail. The neighborhood of the boundary at the top face of the uppermost well layer in the nitride semiconductor laser element of Comparative Example 1 was most susceptible to damage at the resonator facet. It was suggested that this region is weakest, and COD occurs from this area.

Such occurrence of COD could be suppressed by employing a second layer of GaN as in the nitride semiconductor laser element of the first embodiment. The favorable range of the thickness of the second layer formed of GaN was at least 1 nm and not more than 8 nm.

COMPARATIVE EXAMPLE 2

A nitride semiconductor laser element having a structure identical to that of the nitride semiconductor laser element of the first embodiment was produced with the exception that the composition of first layer 1321 and third layer 1323 shown in FIG. 2 was $In_{0.06}Ga_{0.94}N$ (nitride semiconductor laser element of Comparative Example 2).

The properties of the nitride semiconductor laser element of Comparative Example 2 were evaluated under the same condition and same method as those of the nitride semiconductor laser element of the first embodiment. The threshold current was 24 mA and the slope efficiency was approximately 1.4 W/A at room temperature. Therefore, the nitride semiconductor laser element of Comparative Example 2 exhibited degradation in the slope efficiency as compared to that of the nitride semiconductor laser element of the first embodiment.

Then, the nitride semiconductor laser element of Comparative Example 2 was driven continuously in a manner similar to that of the nitride semiconductor laser element of the first embodiment. There were many elements failed with the laser beam output ceased within 500 hours. Upon examining the cause thereof, the failure was attributed to the occurrence of COD.

Conditions to suppress such occurrence of COD was studied. It was confirmed that the In composition ratio of the first layer formed of InGaN and the In composition ratio of the third layer formed of InGaN must be set to less than half the In composition ratio of the well layer. The favorable range of the thickness of the first and third layers formed of InGaN was at least 0.5 nm and not more than 6 nm.

COMPARATIVE EXAMPLE 3

A nitride semiconductor laser element having a structure identical to that of the nitride semiconductor laser element of the first embodiment was produced with the exception that n type impurities were doped into quantum well active layer 105 shown in FIG. 2 (nitride semiconductor laser element of Comparative Example 3).

The properties of the nitride semiconductor laser element of Comparative Example 3 were evaluated under the same condition and same method as those of the nitride semiconductor laser element of the first embodiment. The threshold current was approximately 26 mA and the slope efficiency was approximately 1.4 W/A at room temperature.

Then, the nitride semiconductor laser element of Comparative Example 3 was driven continuously in a manner similar to that of the nitride semiconductor laser element of the first embodiment. There were many elements failed with the laser beam output ceased within 500 hours. Upon examining the cause thereof, the failure was attributed to the occurrence of COD.

The interior of the nitride semiconductor laser element of Comparative Example 3 with COD was analyzed in detail. The neighborhood of the boundary at the top face of the uppermost well layer in the quantum well active layer was most susceptible to damage at the resonator facet. It was suggested that this region is weakest, and COD occurs from this area.

Second Embodiment

A nitride semiconductor laser element having a structure identical to that of the nitride semiconductor laser element of the first embodiment was produced with the exception that undoped $In_{0.03}Ga_{0.97}N$ was employed for the composition of upper adjacent layer 106 shown in FIG. 1 (hereinafter, referred to as nitride semiconductor laser element of the second embodiment).

The properties of the nitride semiconductor laser element of the second embodiment were evaluated by the same conditions and method as those of the nitride semiconductor laser element of the first embodiment. The slope efficiency of the initial property was slightly degraded as compared to that of the nitride semiconductor laser element of the first embodiment. It is considered that this was caused by the slight increase in the absorption of the laser beam at the layer having p type impurities doped or at the p side electrode due to the disproportion of the laser beam distribution at the upper side than in the nitride semiconductor laser element of the first embodiment.

Further, the nitride semiconductor laser element of the second embodiment was driven continuously in a manner similar to that of the nitride semiconductor laser element of the first embodiment. Although at least 300 mW was ensured for the COD level under pulsed condition after 500 hours, exhibiting sufficient improvement in the COD level, the nitride semiconductor laser element of the first embodiment exhibited a more favorable COD level.

As a result of a study, it was identified that, although it is most preferable to have upper adjacent layer 106 formed of undoped GaN, the In composition ratio of upper adjacent layer 106, when formed of InGaN, preferably should be set to less than half the In composition ratio of the well layer, and 0.04 at most.

Third Embodiment

A nitride semiconductor laser element having a structure identical to that of the nitride semiconductor laser element of the first embodiment was produced with the exception that an undoped GaN layer was employed for n type GaN layer 107 (first intermediate layer) shown in FIG. 1 (hereinafter, referred to as nitride semiconductor laser element of the third embodiment)

The nitride semiconductor laser element of the third embodiment had the tendency of slight variation in the oscillation threshold value. However, the result of the long period reliability in the COD level (the COD level under pulsed condition subsequent to continuous driving in a manner similar to that of the nitride semiconductor laser element of the first embodiment) was similar to that of the nitride semiconductor laser element of the first embodiment.

The reason why no problem was identified even in the case where n type GaN layer 107 doped with n type impurities was employed for the first intermediate layer is considered to be based on the fact that n type GaN layer 107 is disposed remote from quantum well active layer 105. In the case where a layer having impurities doped is employed for the first intermediate layer, the thickness of undoped upper adjacent layer 106 is preferably set to at least 5 nm and 50 nm at most.

Fourth Embodiment

A nitride semiconductor laser element having a structure identical to that of the nitride semiconductor laser element of the first embodiment was produced with the exception that undoped GaN was employed for the composition of lower adjacent layer 104 shown in FIG. 1 (hereinafter, referred to as nitride semiconductor laser element of the fourth embodiment).

The properties of the nitride semiconductor laser element of the fourth embodiment were evaluated under the same condition and same method as those of the nitride semiconductor laser element of the first embodiment. As to the initial properties, the threshold current was increased up to approximately 40 mA. This is considered to be caused by the fact that the effect of confining light of quantum well active layer 105 is reduced since the refractive index of lower adjacent layer 104 located next to quantum well active layer 105 became lower than that of the nitride semiconductor laser element of the first embodiment. The result of the long period reliability of the COD level (the COD level under pulsed condition subsequent to continuous driving in a manner similar to that of the nitride semiconductor laser element of the first embodiment) for the nitride semiconductor laser element of the fourth embodiment was similar to that of the nitride semiconductor laser element of the first embodiment.

It was therefore found that lower adjacent layer 104 is preferably formed of undoped GaN, or InGaN having an In composition ratio of less than half the In composition ratio of the well layer and not more than 0.04. The thickness of lower adjacent layer 104 was preferably at least 3 nm and not more than 30 nm.

Miscellaneous

The composition of lower clad layer 102 and upper clad layer 110 may be, but is not particularly limited, to that set forth above. For example, when lower clad layer 102 and upper clad layer 110 are each formed of $Al_zGa_{1-z}N$, z may be at least 0.02 and 0.15 at most. Lower clad layer 102 and upper clad layer 110 may each take a super-lattice structure.

Although silicon (Si), germanium (Ge), tin (Sn), sulfur (S), oxygen (O), titanium (Ti) or zirconium (Zr), for example, can be doped as the n type impurities in the foregoing, it is preferable to employ Si and/or Ge in order to obtain an n type nitride semiconductor crystal of favorable crystallinity. Further, n type impurities are doped under the doping concentration of at least $5 \times 10^{16} cm^3$ and $1 \times 10^{19} cm^3$ at most, more preferably under the doping concentration of at least $1 \times 10^{17} cm^3$ and $4 \times 10^8 cm^3$ at most.

From the standpoint of suppressing lattice mismatch in each nitride semiconductor crystal stacked on the surface of the substrate, AlGaN, SiC, spinel, $Ga_2O_3$, sapphire, $ZrB_2$ or the like may be used other than a GaN substrate, which is most preferable.

The length L from the surface of the topmost well layer of quantum well active layer 105 to the bottom of p type $Al_{0.15}Ga_{0.85}N$ layer 109 (third intermediate layer) is preferably at least 50 nm and 200 nm at most. If this length L is less than 50 nm, the slope efficiency of the nitride semiconductor laser element will be degraded. If length L is longer than 200 nm, it will be difficult to introduce holes from p type $Al_{0.05}Ga_{0.95}N$ upper clad layer 110 over p type $Al_{0.15}Ga_{0.85}N$ layer 109 into quantum well active layer 105, leading to the possibility of degrading the properties of the nitride semiconductor laser element.

Although a third intermediate layer employing p type $Al_{0.15}Ga_{0.85}N$ layer 109 has been described above, the third intermediate layer is not limited thereto. For example, when upper clad layer 110 has a composition of $Al_pGa_{1-p}N$, the composition of the third intermediate layer is preferably $Al_qGa_{1-q}N$ ($p+0.05 \leq q$), wherein q is preferably at least 0.1 and 0.3 at most. When the Al composition ratio of the third intermediate layer is reduced, the driving voltage of the nitride semiconductor laser element tends to become lower. When the Al composition ratio of the third intermediate layer is increased, there is a tendency of the rise of the driving current of the nitride semiconductor laser element being suppressed when at high temperature.

In the foregoing, the length of the resonator of the nitride semiconductor laser element can be set to at least 200 μm and 2000 μm at most, for example. Further, the width of the ridge stripe can be set to at least 0.5 μm and 3 μm at most, for example. In a nitride semiconductor laser element that does not need to have the lateral mode rendered stable at a single lateral mode, the width of the resist stripe may exceed 3 μm. For example, it may be set to at least 1 μm and 1000 μm at most.

Although a nitride semiconductor laser element providing a laser beam output of high power is described in the foregoing, the structure of a nitride semiconductor laser element having such a high COD level is effective also for a general nitride semiconductor laser element that emits a laser beam of low power such as approximately several mW. This is because, although the laser beam output is increased spontaneously to cause the occurrence of COD when surge current and/or static charge is introduced into a nitride semiconductor laser element, the occurrence of such a problem can be reduced in a nitride semiconductor laser element of high COD level.

The present invention is particularly suitable for a nitride semiconductor laser element that emits a laser beam at high power of at least 100 mW, for example, and is also suitable for a nitride semiconductor laser element that emits a laser beam at low power such as approximately several mW.

Further, the present invention is applicable to a single semiconductor laser device, a hologram laser device including a hologram element, an optoelectronics IC device packaged integrally with an IC chip directed to the process of driving or signal detection and the like, or a composite optical device packaged as a waveguide and small optical element.

The present invention is also applicable to an optical recording system, an optical disk system, an illumination system, other systems employing a light source from the near-ultraviolet region to the blue-violet region, including the device set forth above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor laser element comprising a lower clad layer, a lower adjacent layer, a quantum well active layer, an upper adjacent layer, and an upper clad layer, arranged in this order,
   wherein said quantum well active layer includes a plurality of well layers formed of undoped InGaN, and an undoped barrier layer sandwiched between said well layers,
   said barrier layer includes a first layer formed of InGaN, a second layer formed of GaN, and a third layer formed of InGaN,
   an indium (In) composition ratio of said first layer and an indium (In) composition ratio of said third layer are each below half of an indium (In) composition ratio of said well layer;
   the lower adjacent layer is in contact with the well layer in a lowermost part of the quantum well active layer, the lower adjacent layer being undoped and being formed of GaN or InGaN; and
   the upper adjacent layer is in contact with well layer in an uppermost part of the quantum well active layer, the upper adjacent layer being undoped and being formed of GaN or InGaN.

2. The nitride semiconductor laser element according to claim 1, wherein a wavelength of a laser beam output from said quantum well active layer is at least 385 nm and 430 nm at most.

3. The nitride semiconductor laser element according to claim 1, wherein the In composition ratio of said well layer is at least 0.04 and 0.12 at most.

4. The nitride semiconductor laser element according to claim 1, wherein the In composition ratio of said first layer and the In composition ratio of said third layer are each at least 0.005 and 0.04 at most.

5. The nitride semiconductor laser element according to claim 1, wherein wherein an indium (In) composition ratio of said upper adjacent layer is below half the In composition ratio of said well layer.

6. The nitride semiconductor laser element according to claim 1, wherein an indium (In) composition ratio of said lower adjacent layer is below half the In composition ratio of said well layer.

* * * * *